United States Patent
Dirscherl et al.

(10) Patent No.: US 7,185,245 B2
(45) Date of Patent: Feb. 27, 2007

(54) TEST READING APPARATUS FOR MEMORIES

(75) Inventors: Gerd Dirscherl, Munich (DE); Holger Sedlak, Sauerlach (DE); Tobias Schlager, Kumberg (AT)

(73) Assignee: Infineon Technologies AG, Munich (DE)

( * ) Notice: Subject to any disclaimer, the term of this patent is extended or adjusted under 35 U.S.C. 154(b) by 299 days.

(21) Appl. No.: 10/871,523

(22) Filed: Jun. 17, 2004

(65) Prior Publication Data

US 2004/0260989 A1 Dec. 23, 2004

(30) Foreign Application Priority Data

Jun. 17, 2003 (DE) ................................ 103 27 284

(51) Int. Cl.
*G11C 29/00* (2006.01)
(52) U.S. Cl. ................ 714/718; 714/745; 365/201
(58) Field of Classification Search ............. None
See application file for complete search history.

(56) References Cited

U.S. PATENT DOCUMENTS

| | | | | |
|---|---|---|---|---|
| 4,876,684 A * | 10/1989 | Guntheroth | ............... | 714/719 |
| 5,048,019 A * | 9/1991 | Albertsen | .................. | 714/718 |
| 5,127,097 A * | 6/1992 | Mizuta | ...................... | 711/168 |
| 5,153,853 A * | 10/1992 | Eby et al. | .............. | 365/185.08 |
| 5,544,098 A * | 8/1996 | Matsuo et al. | .......... | 365/189.07 |
| 5,602,789 A | 2/1997 | Endoh et al. | | |
| 5,604,756 A * | 2/1997 | Kawata | ...................... | 714/773 |
| 5,652,721 A | 7/1997 | McIntyre | | |
| 5,675,540 A | 10/1997 | Roohparvar | | |
| 5,822,250 A | 10/1998 | Krzentz | | |
| 5,889,702 A * | 3/1999 | Gaultier et al. | .......... | 365/185.2 |
| 5,953,253 A | 9/1999 | Devin et al. | | |
| 5,982,681 A * | 11/1999 | Schwarz | .................. | 365/201 |
| 6,081,453 A | 6/2000 | Iwahashi | | |
| 6,292,398 B1 | 9/2001 | Pasotti et al. | | |
| 6,301,165 B1 * | 10/2001 | Kim | ........................ | 365/200 |
| 6,968,435 B2 * | 11/2005 | Shimoda | ................... | 711/165 |
| 2002/0105832 A1 * | 8/2002 | Kawakami | ............. | 365/185.21 |

FOREIGN PATENT DOCUMENTS

| | | |
|---|---|---|
| DE | 100 63 102 A1 | 8/2001 |
| EP | 0 594 305 A1 | 4/1994 |
| EP | 0 698 890 A1 | 2/1996 |
| JP | 5-325600 A1 | 12/1993 |
| JP | 2000-268593 A | 9/2000 |
| JP | 2001-264398 A1 | 9/2001 |

* cited by examiner

*Primary Examiner*—Albert Decady
*Assistant Examiner*—John P. Trimmings
(74) *Attorney, Agent, or Firm*—Dickstein, Shapiro, LLP.

(57) ABSTRACT

Test reading apparatus having a memory device having individual memory cells, a buffer device, which is connected to the memory device, and which stores data written to the memory cells in the memory device, an apparatus which has an input and an output, at least one test reference source which can be connected to the input of the apparatus by data stored in the buffer device, and a test apparatus, which is connected to the buffer device and to the output of the apparatus, and which is designed to compare a signal at the output of the apparatus with data stored in the buffer device.

8 Claims, 3 Drawing Sheets

TEST READING APPARATUS FOR MEMORIES

CROSS-REFERENCE TO RELATED APPLICATION

This application claims priority to German Patent Application No. 10327284.4, which was filed Jun. 17, 2003, and is incorporated herein by reference in its entirety.

FIELD OF THE INVENTION

The invention relates to a test reading apparatus for test reading a memory device when the memory has been programmed. The invention also relates to a method for test reading stored logic states in a memory device.

BACKGROUND OF THE INVENTION

When nonvolatile read only memories have been programmed, the data stored in the memory are checked. To this end, the data are read again using more stringent criteria than during a later, normal read operation. As an example of this, mention will be made of the read operation in a memory in which the current in a memory cell which is being read in the memory is compared with a reference current. A different reference current is used for a check.

Test reading involves the contents of the individual memory cells in the memory array being read and being compared with a reference current which corresponds to one state for a memory cell. The comparison with the reference current provides a logic weighting. In a second read operation, all of the cells in the memory array are read again and are compared with a reference current which corresponds to the other logic state for a memory cell. A method for test reading stored logic states in a memory device produces a test signal which is dependent on the nominal value of the logic state. This test signal is compared with the logic state which is under test. Since a test signal is always produced for each logic state which is under test, said test signal being used to assess whether the state under test is correct, one read operation for all of the memory device's states under test is sufficient. It goes without saying that each logic state under test for the memory device is stored in a memory cell in the memory device.

During such implementation, the data in the memory are read twice. This results in an increased test time, which has disadvantageous effects on the total production time and hence the costs, particularly during mass production, for example in chip cards.

SUMMARY OF THE INVENTION

It is an object of the present invention to provide an arrangement which permits a shorter test time.

It contains a test reading apparatus having a memory device having individual memory cells and having a buffer device which is connected to the memory device and which stores data written to the memory cells in the memory device. The test reading apparatus also contains an apparatus, which has an input and an output, and at least one test reference source which is switchably coupled to the input of the apparatus by data stored in the buffer device. The test reading apparatus contains a test apparatus which is connected to the buffer device and to the output of the apparatus and which is designed to compare a signal at the output of the apparatus with data stored in the buffer device.

The buffer device is therefore able to select the at least one test reference source which corresponds to the logic state for the memory array's memory cell which is under test. The weighting operation in the test apparatus is always performed with the correct value of the test reference signal. It is thus possible to dispense with a fresh read operation.

A method for test reading stored logic states in a memory device produces a test signal which is dependent on the nominal value of the logic state. This test signal is compared with the logic state which is under test. Since a test signal is always produced for each logic state which under test, said test signal being used to assess whether the state under test is correct, one read operation for all of the memory device's states under test is sufficient. It goes without saying that each logic state under test for the memory device is stored in a memory cell in the memory device.

It is thus advantageous if the apparatus has a sense amplifier. In one development of the invention, the memory device is in the form of a rewritable read only memory or a nonvolatile memory. It can thus be used particularly for use in chip cards. The buffer device is used in an advantageous development for programming the memory device.

One advantageous refinement is for the test reference source to be in the form of two reference signal sources. The signals from the two test reference sources each correspond to a logic state. For this reason, the content of the buffer device can be taken as a basis of respectively connecting a test reference source to an input on the sense amplifier.

In this connection, it is advantageous for the test reference sources to be in the form of current sources or to have a current mirror. Alternatively, it is conceivable for the test reference sources to be in the form of charge stores or charge sources. Hence, in one case a current weighting and in the other case a charge weighting is provided.

In another refinement of the invention, the test reading apparatus is designed for processing a differential signal. This makes it possible to dispense with a test reference source.

BRIEF DESCRIPTION OF THE DRAWINGS

To provide a better understanding, the invention is explained in detail with reference to the drawings, in which.

DETAILED DESCRIPTION OF THE PREFERRED MODE OF THE INVENTION

Figure 1:
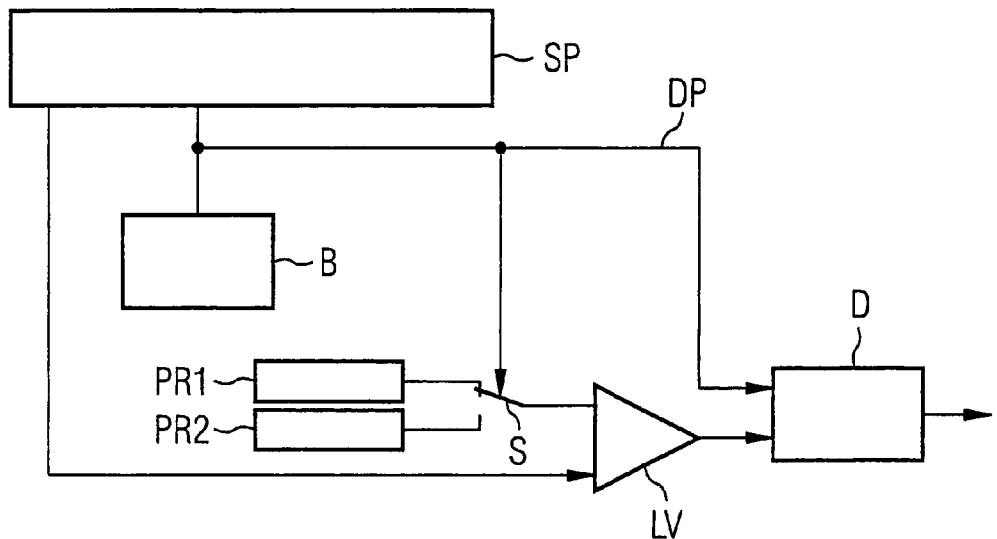
FIG. 1 shows a block diagram of the invention.

FIG. 1 shows a test reading apparatus which is part of a chip (not shown in more detail) in a chip card. The test reading apparatus has a memory device SP which contains a plurality of individual memory cells (not shown here). The individual memory cells in the memory device SP contain a respective one of two logic states in line with their programming.

The data in the memory device SP which correspond to the content of the individual memory cells are likewise stored in the buffer device B, which is connected to the memory device SP. The memory device SP is also coupled to a sense amplifier LV which is in the form of an operational amplifier. A second input on the sense amplifier LV is connected to a switch S which can connect two test reference sources PR1 and PR2 to the second input of the sense amplifier.

The output of the sense amplifier LV is connected to the input of a test device D. The second input of the test device D is coupled to the buffer device B via DP.

A test read operation involves the content of each individual memory cell being compared with a prescribed value, and the result being used to decide whether programming was successful. To this end, the content of a memory cell in the memory device SP is supplied to the sense amplifier LV. The nominal value of this memory cell, which is stored in the buffer device B, is supplied to the detection device D.

At the same time, this nominal value is used to connect the sense amplifier LV to the test reference source associated with the nominal value using the switch S. The signals from the two test reference sources PR1 and PR2 are associated with a respective one of the two logic states of the nominal value. The sense amplifier LV amplifies the difference between the test reference source PR1 or PR2 and the value read from the memory cell and transmits the result to the input of the test device D.

The test device D provides a weighting and decides whether the programming is incorrect. Hence, each logic state for the memory device SP is tested in one read operation.

Figure 2:
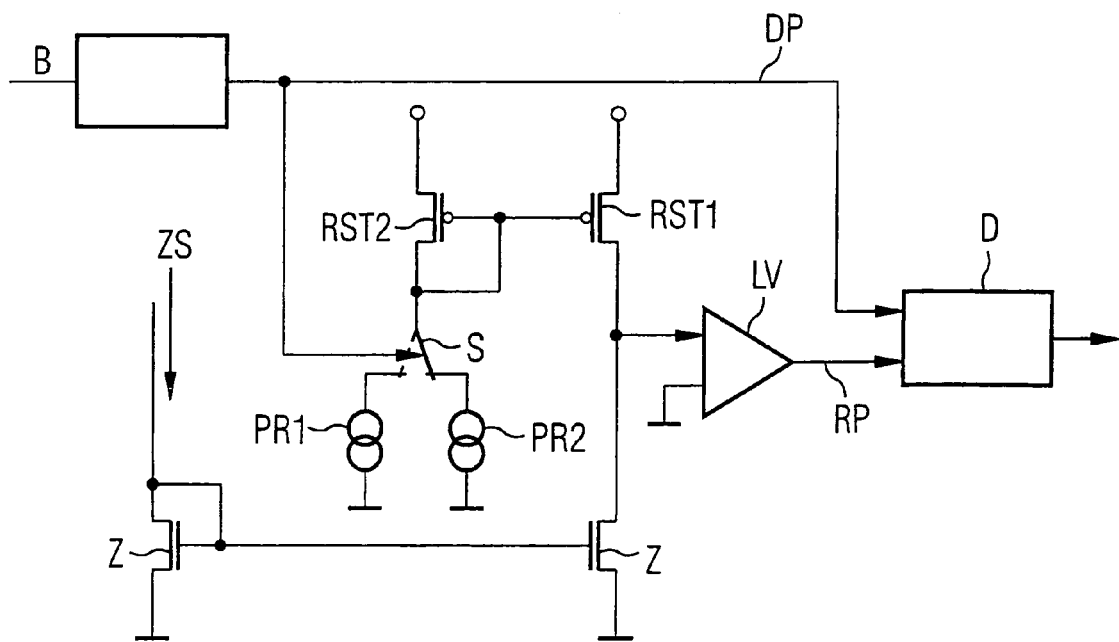
FIG. 2 shows a first exemplary embodiment of the invention.

One specific exemplary embodiment, in which a current weighting is provided using reference currents, can be seen in FIG. 2. In this case, identical components have the same reference symbols, and a repeat explanation is dispensed with.

In this exemplary embodiment, the cell current ZS in each memory cell is read. This cell current is supplied to a current mirror which is formed from two MOSFET transistors Z. The drain contacts of the two transistors Z are grounded in this case. The gate contacts of the transistors Z are connected to the source contact of one transistor Z, to which the cell current ZS in a memory cell from the memory device is supplied.

The second source contact is coupled to the input of the sense amplifier LV and to the drain contact of a first transistor RST1, which forms a current mirror together with a second MOSFET transistor RST2. The source contacts of the two MOS transistors RST1 and RST2 are connected to a supply potential. The drain contact of the second MOS transistor RST2 is coupled to the gate contacts of the two transistors RST1 and RST2 and to the switch S.

The switch S switchably couples two test reference sources PR1 and PR2 to the source contact of the MOS transistor RST. The test reference sources PR1 and PR2 are in the form of current sources. The choice of the switch position is made using the content of the buffer device B. The buffer device B has a connection DP to the test device D. The second input of the test device D is connected to the output of the sense amplifier LV by means of a connection RP.

A test read operation involves the content of a memory cell being read, which results in a cell current ZS which is supplied to the current mirror comprising the two MOS transistors Z. At the same time, the nominal value of this memory cell is communicated to the test device via the line DP, and the switch S is connected to the associated reference current source PR1 or PR2.

Depending on the test reference source PR1 or PR2 chosen, a current of differing intensity flows via the transistor RST2. Hence, the voltage drop across the transistor RST1 also changes.

At the same time, a cell current ZS allowing a current to flow via the two transistors Z flows on the basis of the content of the memory cell. Depending on this flow of current, the voltage drop across Z changes. This pulls the input of the sense amplifier LV to different potentials. By way of example, appropriate connection results in the ground potential or the reference-ground potential being established at the input of the sense amplifier LV. Following difference formation and amplification by the sense amplifier LV, the weighting is provided by the test device D.

Figure 3:
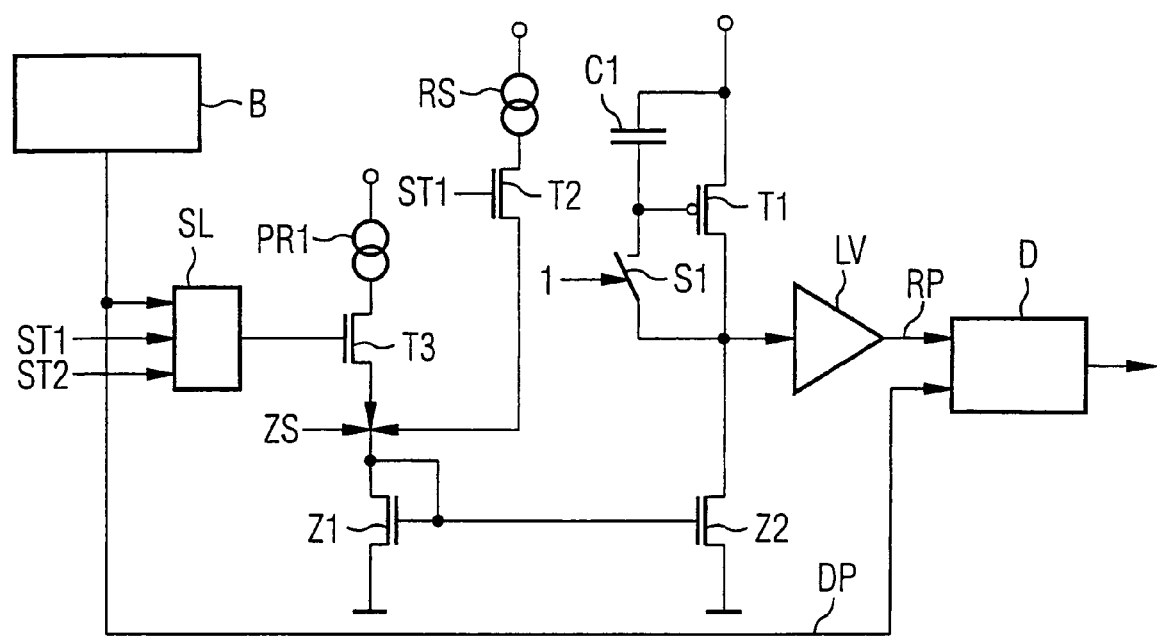
FIG. 3 shows a second exemplary embodiment.

A second exemplary embodiment, in which the read operation takes place as a differential signal, is shown in FIG. 3. In this case too, identical reference symbols signify the same components. A reference current source RS is connected via a transistor T2 to the drain contact of a second transistor T3. In addition, the drain contact of the transistor T3 is connected to a device (not shown here) which supplies the cell current ZS. It is also coupled to the source contact and to the gate of a first transistor Z1 and to the gate of a second transistor Z2, which therefore represent a current mirror.

The drain contacts of the transistors Z1 and Z2 representing the current mirror are connected to ground. The second source contact of the second transistor Z2 is connected to the sense amplifier LV, to a switch S1 and to a drain contact on a transistor T1. The switch S1 is connected to the gate contact of the transistor T1 and via a capacitor C1 to the source contact of the transistor T1 and also to a reference-ground potential. The output of the sense amplifier LV is routed to the test device D via the connection RP.

The content of a memory cell within the memory array is read in the form of a differential signal using the buffer device B in two time periods. In a first period ST1, the switch S1 is closed and the offset current is determined, this being made up of any unwanted cell current ZS in the memory cell from the memory device and the reference current RS. Ideally, the cell current ZS is small. During this first phase, the transistor T2 is therefore on, and T3 is in an off state. After that, the switch S1 is opened and the reference current is thus disconnected. The offset current produced in the first phase, as the sum of the reference current and any cell current ZS which there may be, is now stored in the transistor T1. During the period ST2, the memory cell is turned on and the memory cell is read. A cell current ZS flows. This current is supplied to the sense amplifier LV via the current mirror. If the cell current ZS is larger than the offset current determined during the period T1, this corresponds to one logic state, otherwise it corresponds to the other.

During test reading, there is now the option of impressing an additional test reference current PR1 on the offset current or on the cell current ZS via a circuit logic unit SL either during the period ST1 or during the period ST2, depending on the buffer B shown here.

Figure 4:
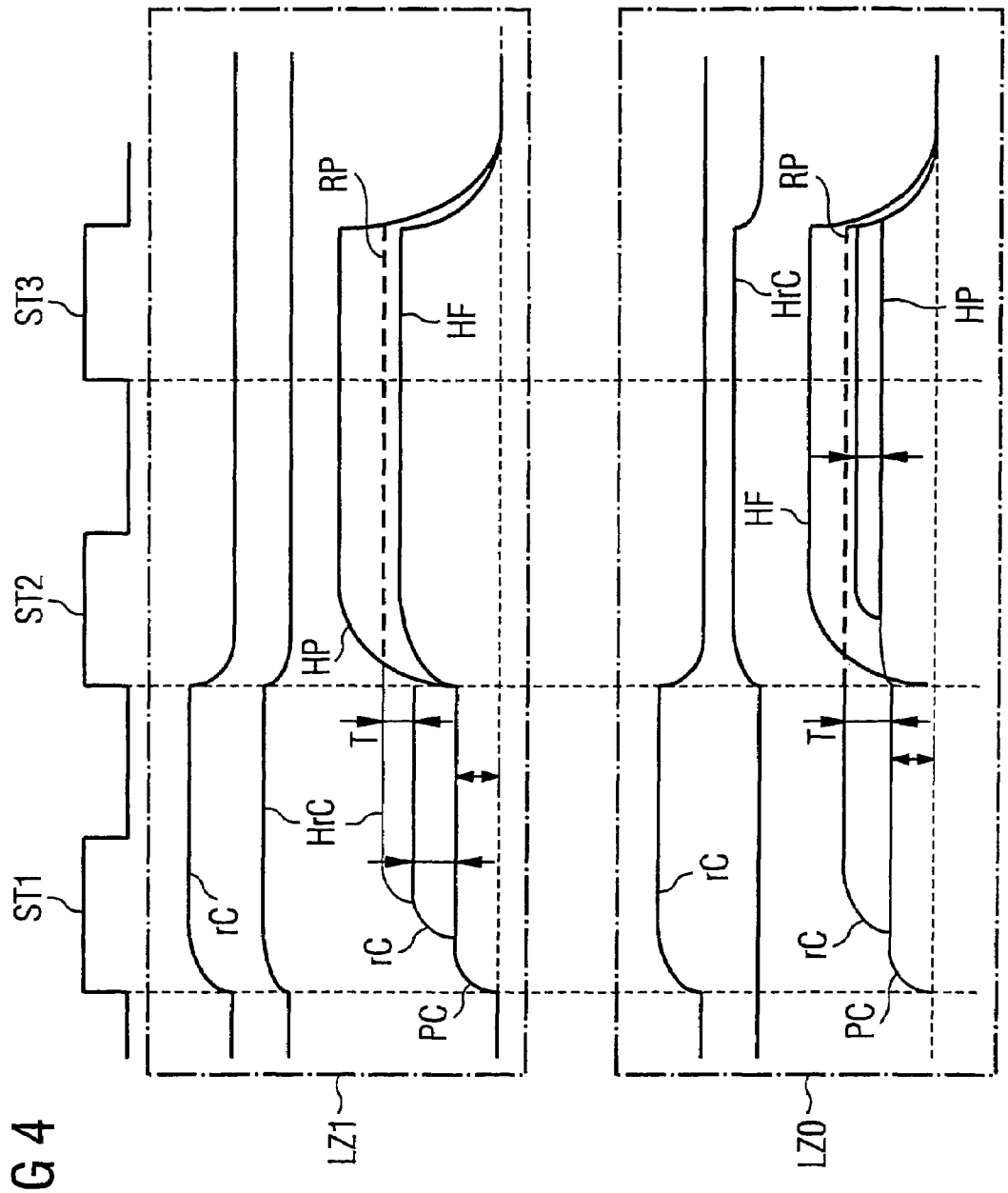
FIG. 4 shows a current/time graph for the second exemplary embodiment.

The results of such measurement in the circuit in FIG. 3 are shown in FIG. 4 by way of example. FIG. 4 shows the current wave form within a test read operation for the logic state LZ1 and the logic state LZ0. During the state LZ1, in which the intention is to test whether the memory cell has the logic state 1, the reference current source RS is switched in by the transistor T2 and the test current source PR1 is switched in by the circuit logic unit SL during the period ST1. These result in a reference current rC and a test current HrC during the period ST1. The sum of these two currents plus any current PC which there may be from the cell array or the memory cell produces the reference level RP. During the period ST2, the reference current source and the test reference current source are turned off and just the current PC from the memory cell is measured. If the current from the memory cell or from a cell array is above the reference level RP, then the test has been passed, and if it is below then programming was probably incorrect.

For the second logic state LZ0, the test reference current HrC is first turned on during the period ST2. The reference level is therefore obtained after the period ST1 from the sum of the reference current rC, the reference current source RS and also any cell current PC which there may be from the cell array or from the memory cell. If the sum of the cell array PC and the test reference current HrC is above the reference level RP, then programming was probably incorrect and the test indicates an error. If the current is below, then programming was successful.

The period ST3 is used to transfer the circuit to a basic state.

This arrangement can therefore be used to test individual memory cells in a memory device in one pass. Knowledge of the nominal value of the memory cell through the agency of the buffer device is used to select the correct reference value in one step. In this case, it is not necessary for the buffer device, including the test device, to be located with the memory on one chip, but rather the memory device, such as a flash memory, EEPROM, EPROM or others, may be part of a chip card, while the buffer device and the test device, in particular, are part of a test apparatus for checking such a chip card.

The invention claimed is:

1. A test reading apparatus comprising:
    a memory device having individual memory cells in which values are stored corresponding to one of two logical states;
    a buffer device, which is connected to the memory device, and which stores nominal values;
    a sense amplifier comprising a first input, a second input, and an output, the sense amplifier amplifying a difference of signals at its inputs and connected to the memory device with the first input for receiving a signal which corresponds to the logical state of one memory cell of the memory device;
    at least one test reference source;
    a switching device being arranged between the at least one test reference source and the second input of the sense amplifier for coupling the at least one test reference source with the second input of the sense amplifier depending on a signal of the buffer device, wherein the signal corresponds to the nominal value of the one memory cell; and
    a test apparatus, which is connected to the buffer device and to the output of the sense amplifier, which is designed to compare a signal at the output of the sense amplifier with the signal of the buffer device and which provides a testing result.

2. The test reading apparatus as claimed in claim 1, wherein the memory device is selected from the group consisting of a nonvolatile memory, a rewritable memory, and both a nonvolatile and a rewriteable memory.

3. The test reading apparatus as claimed in claim 1, further comprising a second test reference source,
    wherein the switching device couples one of the first and the second test reference sources with the second input of the sense amplifier depending on the signal of the buffer device.

4. The test reading apparatus as claimed in one claim 1, wherein the at least one test reference source has a current mirror.

5. The test reading apparatus as claimed in claim 1, wherein the at least one test reference source is a charge store.

6. The test reading apparatus as claimed in claim 1, wherein the switching device comprises a circuit logic unit which adds a signal from the at least one test reference source to the signal from the one memory cell during at least one period depending on the signal of the buffer device.

7. The test reading apparatus as claimed in claim 1, wherein the buffer device is used to program the memory device.

8. A method for test reading stored logic states in a memory device, the method comprising:
    reading and providing the logical state of a memory cell of the memory device as a signal to a sense amplifier;
    selecting a test signal depending on a nominal value of the memory cell;
    amplifying a difference between the signal and the test signal; and
    comparing the nominal value of the memory cell to the amplified difference.

* * * * *

UNITED STATES PATENT AND TRADEMARK OFFICE
CERTIFICATE OF CORRECTION

| | | |
|---|---|---|
| PATENT NO. | : 7,185,245 B2 | |
| APPLICATION NO. | : 10/871523 | |
| DATED | : February 27, 2007 | |
| INVENTOR(S) | : Gerd Dirscherl et al. | |

It is certified that error appears in the above-identified patent and that said Letters Patent is hereby corrected as shown below:

In the Specification, at column 1, line 35, everything is deleted from the sentence beginning "A method ..." to the end of the paragraph at line 45.

At line 36, the following paragraph is inserted:

--This produces, for each memory cell in the memory array, a weighted logic value for the two reference currents corresponding to the binary states. The actual comparison to determine whether the states for the individual memory cells match the nominal values is performed by software or hardware in a subsequent step.--.

At column 2, line 11, "which under" should read --which is under--.

Signed and Sealed this

First Day of May, 2007

JON W. DUDAS
*Director of the United States Patent and Trademark Office*